(12) United States Patent
Kelso (10) Patent No.: US 9,805,819 B1
(45) Date of Patent: *Oct. 31, 2017

(54) ADDRESS CIRCUIT (71) Applicant: Amazon Technologies, Inc., Seattle, WA (US)

(72) Inventor: Carl Ryan Kelso, Seattle, WA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/293,821

(22) Filed: Oct. 14, 2016

Related U.S. Application Data (63) Continuation of application No. 14/580,908, filed on Dec. 23, 2014, now Pat. No. 9,478,312.

(51) Int. Cl.
*G06F 9/30* (2006.01)
*G11C 19/00* (2006.01)
*G11C 19/38* (2006.01)

(52) U.S. Cl.
CPC .............. *G11C 19/00* (2013.01); *G11C 19/38* (2013.01)

(58) Field of Classification Search
None
See application file for complete search history.

(56) References Cited

U.S. PATENT DOCUMENTS

| | | | |
|---|---|---|---|
| 5,553,010 A | 9/1996 | Tanihira et al. | |
| 5,778,241 A | 7/1998 | Bindloss et al. | |
| 5,901,177 A | 5/1999 | Sohn | |
| 5,907,498 A | 5/1999 | Rim | |
| 5,924,114 A | 7/1999 | Maruyama et al. | |
| 5,948,050 A | 9/1999 | Diamondstein et al. | |
| 6,272,257 B1 | 8/2001 | Prokop | |
| 2001/0016861 A1* | 8/2001 | Lin | G06F 5/01 708/209 |
| 2003/0023646 A1 | 1/2003 | Lin et al. | |
| 2004/0024800 A1* | 2/2004 | Lin | G06F 5/01 708/209 |
| 2004/0120352 A1 | 6/2004 | Jungerman | |
| 2004/0158596 A1 | 8/2004 | Fujiki | |
| 2004/0215681 A1* | 10/2004 | Lin | G06F 7/76 708/209 |
| 2005/0219897 A1* | 10/2005 | Lin | G06F 5/01 365/185.03 |

(Continued)

*Primary Examiner* — Mano Padmanabhan
*Assistant Examiner* — Jean Edouard
(74) *Attorney, Agent, or Firm* — Lee & Hayes, PLLC (57) ABSTRACT

Described herein are techniques, systems, and circuits for addressing image data according to blocks. For example, in some cases, the address space may be divided into high order address bits and low order address bits. In these cases, an address circuit may twist an address space by shifting the high order bits and low order bits of an address in a rightward direction, shifting the low order bits of the address in a leftward direction, and shifting the high order bits and the low order bits of the address in the leftward direction. The circuit may modify the address value and untwist the address space. For example, the untwisting may include shifting the high order bits and the low order bits of an address in the rightward direction, shifting the low order bits of the address in the rightward direction, and shifting the high order bits and the low order bits of the address in the leftward direction.

20 Claims, 9 Drawing Sheets

(56) References Cited

U.S. PATENT DOCUMENTS

| | | | |
|---|---|---|---|
| 2006/0235914 A1* | 10/2006 | Lin | G06F 5/01 |
| | | | 708/200 |
| 2006/0236021 A1* | 10/2006 | Chotard | G06F 12/04 |
| | | | 711/5 |
| 2011/0109488 A1 | 5/2011 | Nakajima | |
| 2016/0092228 A1 | 3/2016 | Gschwind | |

* cited by examiner

ADDRESS CIRCUIT

CROSS-REFERENCE TO RELATED APPLICATION(S)

This application is a continuation of U.S. application Ser. No. 14/580,908, filed on Dec. 23, 2014, and entitled "Address Circuit," the entirety of which is incorporated herein by this reference thereto.

BACKGROUND

Image processing is computationally expensive and in some cases, requires dedicated circuits and/or processors. However, in many applications and systems both processing resources and available power supply are limited, thereby restricting the image processing techniques and/or systems that may be utilized. Additionally, in some cases, the designers of image processing devices are forced to choose between accessing large amounts of image data when processing even small blocks and/or complex addressing schemes that increase the overall complexity and energy consumption of the devices.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

DETAILED DESCRIPTION

Described herein are devices and techniques for enabling processing image data in constrained environments. For example, in some cases, when image data is processed by an image processing unit, microcontroller, processor, or other processing components, the image data is accessed either one row or one column at a time, as the address circuit unit increments sequentially through the address space. However, in many cases, the portion of the image that the image processing unit is accessing may be a 2D region better represented as a square of pixels overlapping the region of interest (ROI) than a collection of scan-lines. Unfortunately, to access the particular region, the image processing unit accesses many pixels that are unrelated to the region, as each pixel of a row or a column containing one or more pixels associated with the particular region are accessed when the image is parsed by rows and/or columns. Thus, in some implementations described herein, an image processing system for addressing image data according to blocks of image data (e.g., $(X^2) \times (Y^2)$, 2×2, 4×4, 9×9, etc.) is disclosed, thereby reducing the overall number of pixels that are accessed when processing the region.

For example, in some implementations, a circuit for addressing image data may include three barrel shifters to twist the address space, an arithmetic logic unit (ALU) to modify the address value, and three additional barrel shifters for untwisting the address space. For instance, the column (Y) address bits may be represented as the high order bits in the address space and the row (X) address bits may be represented as the low order bits in the address space. In this instance, the first set of three barrel shifters may cause at least one of the column address bits to be moved or shifted into the row address space. In this manner, the column address space may be incremented or the column address may change earlier than expected or the image data to be accessed out of order. The second set of three barrel shifters may cause the column address bits to be shifted back to the column address space in order to restore the native addressing format of the image data. While this example includes three barrel shifters to twist and untwist the address space, those having ordinary skill in the art will appreciate that fewer or more barrel shifters may be used for the twisting and untwisting operations.

In an example, the first barrel shifter of the first set may shift the combined column address bits and the row address bits to the right. The second barrel shifter of the first set may shift the row address bits to the left. The third barrel shifter of the first set may shift the combined column address bits and the row address bits to the left. The ALU may modify the address. For example, the ALU may be an incrementer that may increase the address value by one. However, due to the shifting of the address space in some instances the column address bits are incremented instead of the lower order row address bits. In this manner, the image data may be accessed in blocks rather than as rows or columns. Once the address ALU modifies the address bits, the first barrel shifter of the second set may shift the combined column address bits and the row address bits to the right. The second barrel shifter of the second set may shift the row address bits to the right. The third barrel shifter of the second set may shift the combined column address bits and the row address bits to the left. In this manner, the address bits are returned to a state that preserves the mapping of the address to the image data.

In some cases, the size of the data blocks may be fixed, such as 2×2 or 4×4. In other cases, the size of the block of image data being accessed may be set on the fly or at the time of access. For example, a block size may be set, such as "block size=S" and blocks of image data accessed may be $(2^S) \times (2^S)$. In some cases, additional, address bits may be utilized to express, for example, the size S or the size of the data block to be accessed. In some examples, the block size may be expressed as a number of address bits equal to the log$_2$ of the number of pixels in a column (or number of bits in the Y dimension) or log$_2$ of the number of pixels in a row (or number of bits in the X dimension). The number of bits needed to effectively represent the block size S can be described as ceiling(log$_2$(log$_2$(max(width, height)))), as a block size larger than the original image is a degenerate answer equivalent to a block size of 1 pixel.

Figure 1:
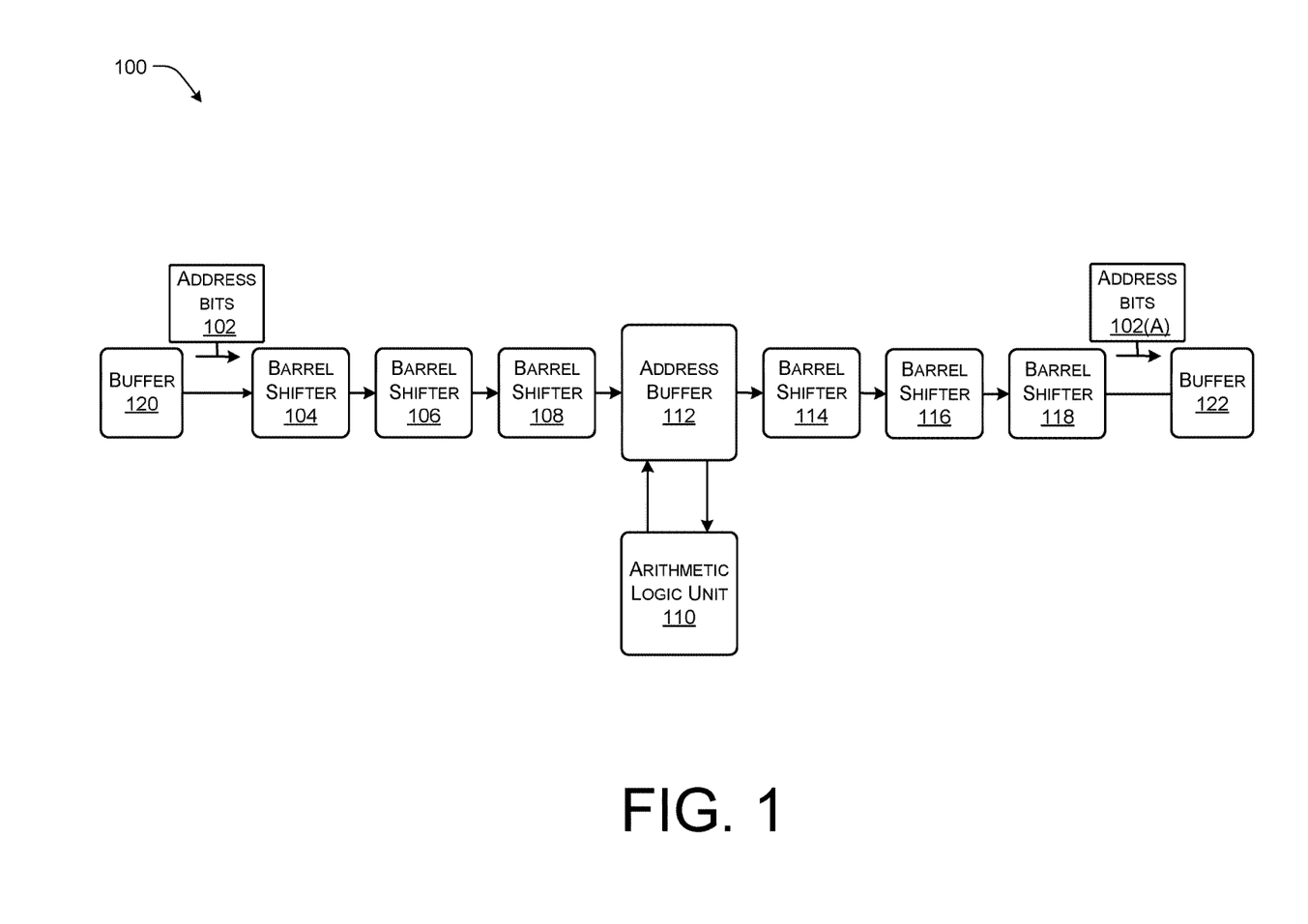
FIG. 1 illustrates a block diagram showing select components of an address circuit according to some implementations.

FIG. 1 illustrates a block diagram showing select components of an address circuit 100 according to some implementations. The address circuit 100 may be configured to update an address space or increment address bits 102 associated with image data. In the illustrated example, the address circuit 100 may be configured to increment the address such that the image data may be accessed in square blocks. For example, the address circuit 100 may be configured to shift at least some of the high order address bits into the low order address space, increment the address bits, and to move the high order address bits back into the high order address state to preserve the address bit to data bit mapping prior to sending an address to an image processing unit.

In the illustrated example, the address circuit 100 includes a first barrel shifter 104, a second barrel shifter 106, and a third barrel shifter 108 in a data path before an address ALU 110. As described above, the barrel shifters 104-108 may be configured to twist the address space (e.g., moving some of the high order address bits into the low order space). For instance, if the address space includes the column address bits as the high order bits and the row address bits as the low order bits, the barrel shifters 104-108 may shift some of the column address bits into the row address space, as described in more detail below with respect to FIG. 3 below.

The twisted address bits may be stored in an address buffer 112 that allows the address ALU 110 to modify the address bits 102 (e.g., increases the address value of the address by one or more). For example, the ALU 110 may be an incrementer configured to increase the value of the address by one. In this example, the twisted address bits may be passed back and forth between the address buffer 112 and the ALU 110 until a desired number of increments has been applied. In this manner, the address circuit 100 may modify the address by an amount greater than one without needing to untwist and re-twist the address bits 102. Incrementing of this kind may be driven by a clock line, resulting in far simpler, faster communications, and potentially cheaper device packages.

In this example, since at least some of the column address bits have been shifted into the low order address space, the ALU 110 may modify the column address bits before reaching the end of the current row. In some cases, the ALU 110 may increment by one but in other cases, the ALU 110 may be configured to increment by a predetermined number of bits, such as to extract the red sub-pixels from RGBA data.

The address circuit 100 also includes a fourth barrel shifter 114, a fifth barrel shifter 116, and a sixth barrel shifter 118 in the data path after the ALU 110. As described above, the barrel shifters 102-106 may be configured to untwist the address space (e.g., moving the shifted high order address bits from the low order space back into the high order space). For instance, if the address space includes the column address bits as the high order bits and the row address bits as the low order bits, the barrel shifters 114-118 may shift the column address bits back into the column address space to preserve the mapping of the address bits to the image data bits, as will be described in more detail with respect to FIG. 4 below.

In some implementations, each of the barrel shifters 102-106 and 114-118 may be formed from one or more pass gates and configured to shift the address bits in a slightly different manner. In an example, the address space includes the column address bits as the high order bits and the row address bits as the low order bits (e.g., the image data is address by rows then columns). In the current example, the barrel shifter 104 may be configured to shift the column address bits and the row address bits to the right by a predetermined number of bits based on the block size. The barrel shifter 104 may be configured to shift the row address bits to the left by the predetermined number bits. The barrel shifter 106 may be configured to shift the column address bits and the row address bits to the left by the predetermined number of bits. The ALU 110 may increment the address bits to access the next pixel.

Similarly, in the current example, the untwist operation including the barrel shifter 114 may be configured to shift the column address bits and the row address bits to the right by a predetermined number of bits based on the block size. The barrel shifter 116 may be configured to shift the row address bits to the right by the predetermined number bits. The barrel shifter 118 may be configured to shift the column address bits and the row address bits to the left by the predetermined number of bits. At this time, the address bits 102 have been returned to their original position within the address space.

Additionally, in some implementations, a first optional buffer 120 may be positioned before the barrel shifter 104 and a second optional buffer 122 the illustrated example a first buffer 120 may be positioned after the barrel shifter 118. For instance, the buffers 120 and 122 may be utilized to store the address bits 702 before and after the ALU 110 modifies the address value.

Figure 2:
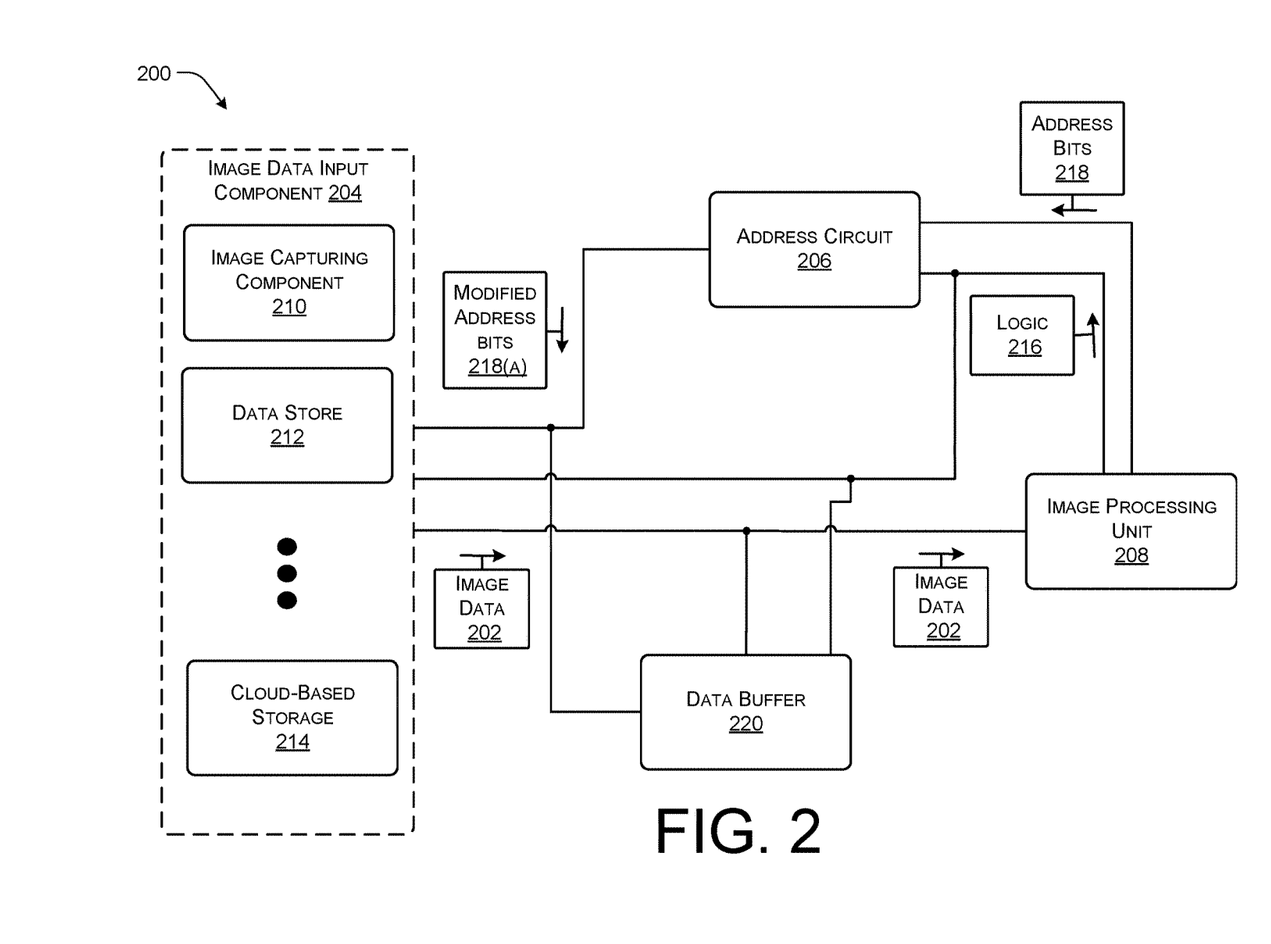
FIG. 2 illustrates another block diagram showing select components of image processing system according to some implementations.

FIG. 2 illustrates another block diagram showing select components of image processing system 200 according to some implementations. For example, in many situations, image data may be processed as blocks or square regions of the image itself. For instance, when processing an image of the American Flag, the region containing the stars may be the only region of interest. In traditional addressing systems, addressing a block of data from the stars portion would require addressing and transfer of data along the length of the stripes. Image processing system 200 is configured to access the image data in blocks, such that when processing the portion containing stars, very little time is wasted accessing pixels outside the ROI.

The image processing system 200 includes an image data input component 204, an address circuit 206, and an image processing unit 208. In some cases, the image data input component 204 may be an image capturing component 210, such as such as cameras or sensors capable of capturing image data from an environment. In other cases, the image data input component 204 may also be a data store or other computer-readable storage device associated with the image processing system 200. For example, the data store 212 may be an example of tangible non-transitory computer storage media and may include volatile and nonvolatile memory and/or removable and non-removable media implemented in any type of technology for storage of information such as image data and/or high definition image data, data structures, or other data. Such computer-readable media may include, but is not limited to, RAM, ROM, EEPROM, flash memory or other computer-readable media technology, CD-ROM, digital versatile disks (DVD) or other optical storage, magnetic cassettes, magnetic tape, solid state storage, magnetic disk storage, RAID storage systems, storage arrays, or any other medium that may be used to store information and which can be accessed by the image processing unit 208. In still other cases, the image data input component 204 may be a cloud-based storage 214, network accessible storage, storage area networks, or other type of remote storage device.

In some implementations, the address circuit 206 may be a circuit configured to receive the address bits 218 associated with the image data 202 and to modify or increment the address based at least in part on the block size indicated in a control logic signal 216. For instance, in some examples, the address space may be twisted by rearranging the address bits 218 prior to incrementing the address value, such that the image data 202 may be walked through or accessed by the image processing unit 208 in square blocks corresponding to the block size rather than column by column or row by row. For example, the address circuit 206 may be the address circuit 100 of FIG. 1.

In some particular implementations, the address circuit 206 may include a first set of barrel shifters for twisting the address space by shifting the location of the address bits 218 within the address space, an ALU for modifying or incrementing the address value, and a second set of barrel shifters for untwisting the address space by moving the address bits 218 back to an original location within the address space. For example, a first barrel shifter of the first set may shift the combined column address and the row address bits to the right by a number of bits indicated by the block size. The second barrel shifter of the first set may shift the row address bits to the left by a number of bits indicated by the block size. The third barrel shifter of the first set may shift the combined column address and two address bits to the left by a number of bits indicated by the block size.

The ALU may modify the value represented by the twisted address space. The results of these operations are modified by the untwist operation and will respect the block layout of the memory bits corresponding to the address space to cause the image data to be accessed in square blocks rather than row by row or column by column. For instance, at least some of the column address bits may be pushed or shifted into the row address space to cause the address circuit 206 to cause the column address value to increment earlier than expected and for the address to, thus, update the column address prior to reaching the end of a row.

The second set of barrel shifters may untwist the address space to translate the block modified address to the original row-column address space (e.g., the mapping to the image data 202 prior to the image processing unit 208 performing one or more operations on the image data 202). For instance, a first barrel shifter of the second set of barrel shifters may shift the combined column address bits and the row address bits to the right by a number of bits indicated by the block size 216. The second barrel shifter of the second set of barrel shifters may shift the row address bits to the right by a number of bits indicated by the block size. The third barrel shifter of the second set may shift the combined column address bits and the row address bits to the left by a number of bits indicated by the block size. In this manner, the address bits are returned to a location within the address space, generally illustrated by modified address bits 218(A), that allows the image processing unit 208 to accurately access the image data 202.

The image processing unit 208 may be an accesses component such as at least one or more control logic circuits, microcontroller, central processing units, graphics processing unit, digital signal processing unit, general purpose processors or other processing units. In general, the image processing unit 208 may be configured to perform one or more image processing techniques on the image data.

In some implementations, the image processing system 200 also includes a data buffer 220 for storing the image data while the image data is being processed by the image processing unit 208. For example, the block of data being accessed (e.g., the block of image data defined by the block size and the address bits 218) may be stored in the data buffer 220, while the image processing is performed by the image processing unit 208. When the image processing unit 208 completes the processing on the block of data, a second block of data may be loaded into the data buffer 220. In some examples, the data buffer 220 may continue to store block of data until the image processing unit 208 has completed each task associated with the image data.

Figure 3:
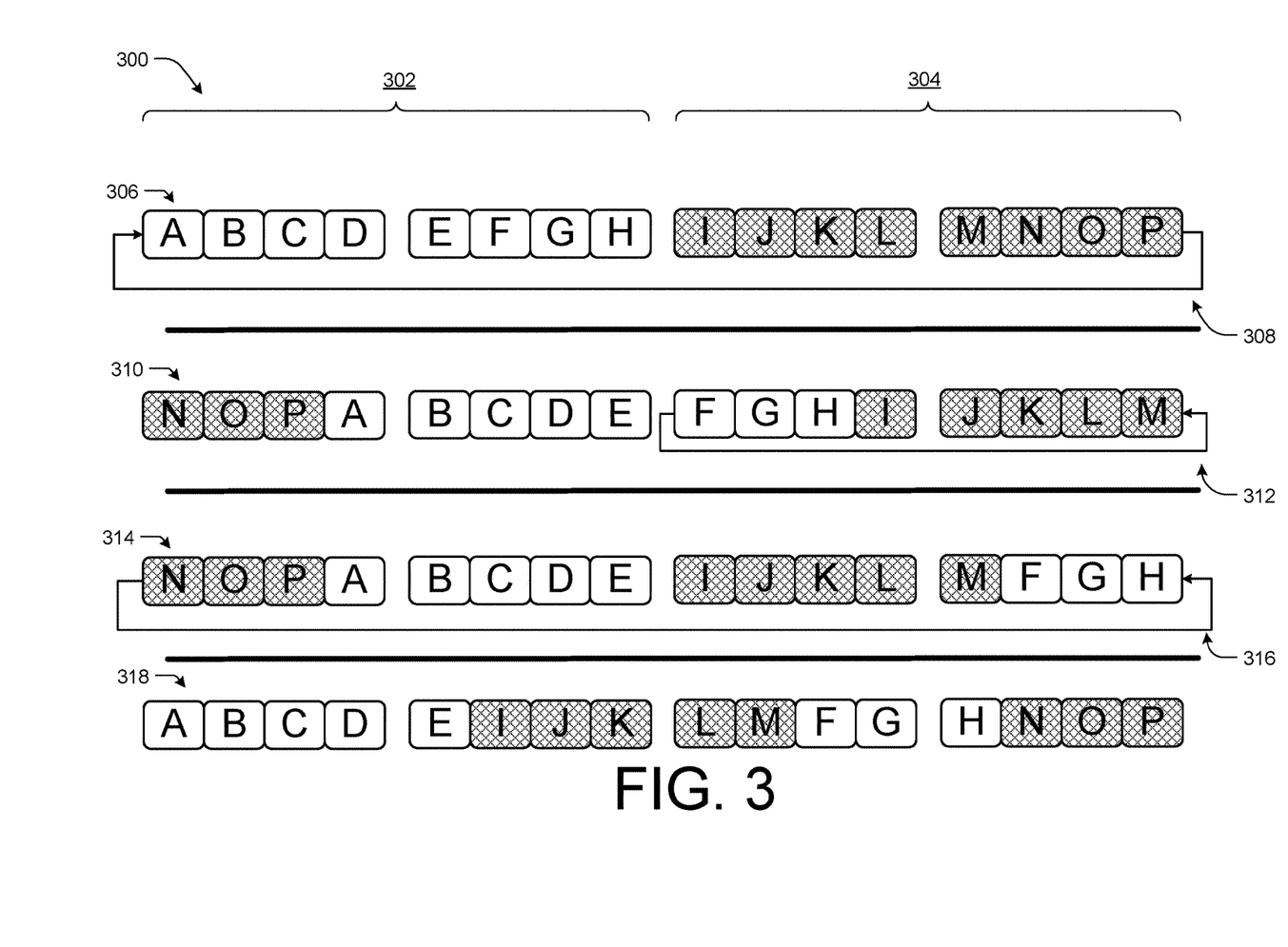
FIG. 3 is an example depicting a three step twist process performed on an address space according to some implementations.

FIG. 3 is an example depicting a three step twist process performed on an address space 300 according to some implementations. In general, this example shows the operations corresponding to a first set of barrel shifters as applied to the address space 300. In the illustrated example, the address space 300 includes a column address space 302 or a high order address space and a row address space 304 or a low order address space. In this example, the column address bits "ABCD EFGH" are assigned to represent the column address space and row address bits "IJKL MNOP" are assigned to represent the row address space. Thus, the address bits shown in the address space 306 that illustrates prior to twisting.

In the illustrated example, a first shift 308 on the address space 300 is shown by the line under the address space 306. In some cases, the first shift 308 may be performed by a first barrel shifter of the first set of barrel shifters and cause the entire address space 306 or the combined column address space 302 and the row address space 304 to shift to the right by a predetermined number of bits. The address space 310 illustrates the address space 300 after the first shift 308 has been completed. Thus, in the illustrated example, the column address bits "FGH" have been moved into the row address space 304 and the row address bits "NOP" have been moved into the column address space 302.

A second shift 312 is applied to the row address space 304. The second shift 312 may be applied by a second barrel shifter of the first set of barrel shifters and cause the bits in the row address space 304 to shift to the left by the predetermined number of bits (e.g., the same number of bits the address space 300 was moved in the first shift 308). The address space 314 illustrates the address space 300 after the second shift 312 has been completed. Thus, after the second shift 312, the column address bits shown in the address space 314 are the same bits as in the address space 310, as the bits in the column address space 302 was not moved as part of the operations associated with the second shift 312. However, the bits in the row address space 304 of the address space 314 have been moved to "IJKL MFGH" from "FGHI JKLM" shown in the address space 310.

A third shift 316 is applied to the entire address space 300 or to the combined column address space 302 and the row address space 304 to move the column address bits and the row address bits to the left by the predetermined number of bits (e.g., the same number of bits in the first shift 308 and the second shift 312). For instance, a third barrel shifter of the first set of barrel shifters may cause the third shift 316 shown by the line under the address space 314. The address space 318 illustrates the address space 300 after the third shift 316 has been completed. Thus, in the illustrated example, the column address space 302 includes the bits "ABCD EIJK" and the row address space 304 includes the bits "LMFG HNOP." Thus, the column address bits "FGH" has been relocated into the row address space 304, such that the value represented by the column address bit "H" may increment in place of the row address bit "M". Additionally, it should be understood that the twisting process maintains a least some of the lowest order row address bits, such as "NOP" in the illustrated example, such that the row address bits "NOP may still increment as normal.

It should be understood, that an additional three shifts may be applied to reverse the twisting performed in the illustrated example after the address is incremented and prior to the address being provided to an image processing unit. For instance, FIG. 4 below provides an illustrative example of the untwist process.

Figure 4:
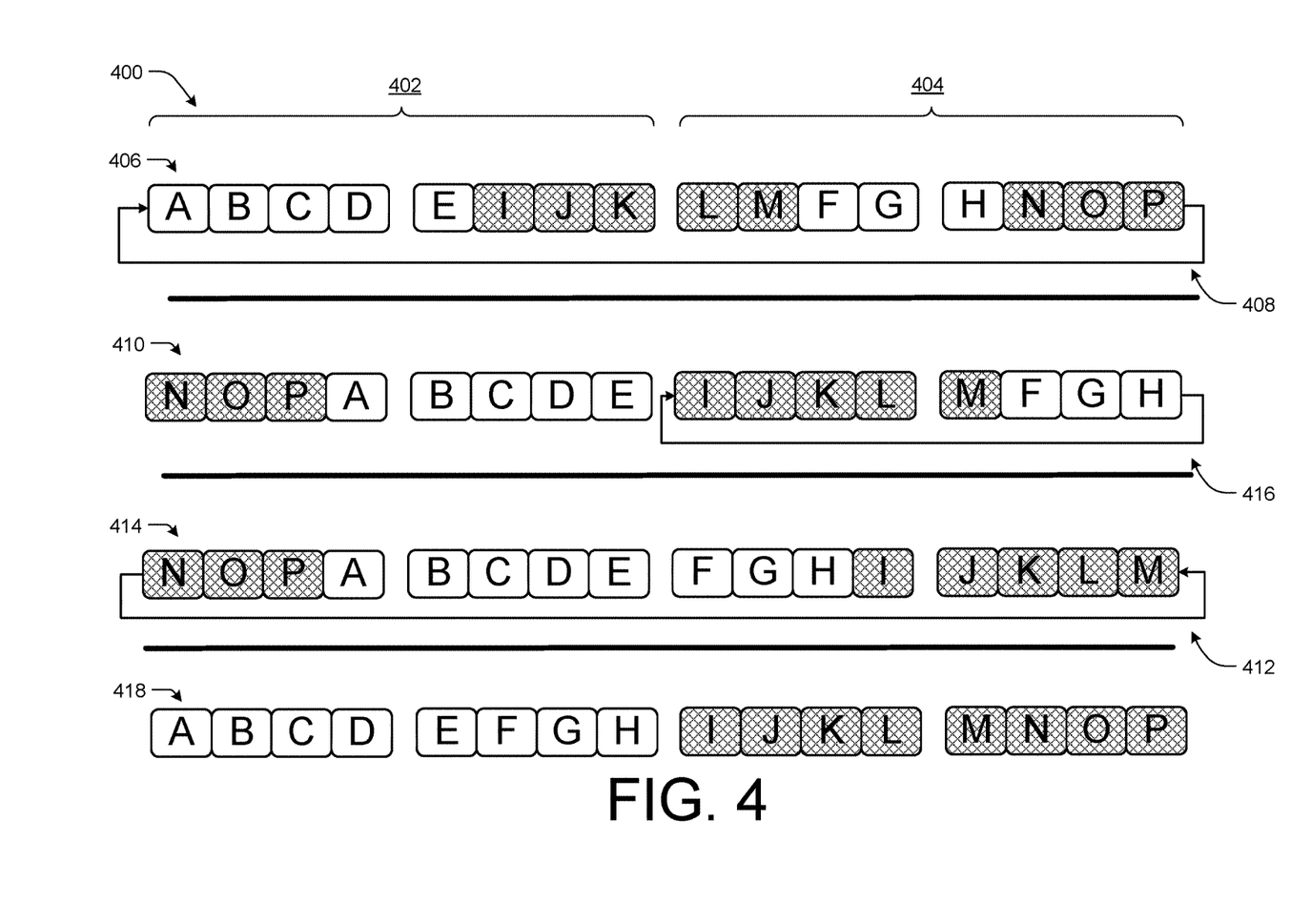
FIG. 4 is an example depicting a three step untwist process performed on an address space according to some implementations.

FIG. 4 is an example depicting a three step untwist process performed on an address space 400 according to some implementations. The illustrative examples, beings after an ALU has incremented the value represented by the twisted address space 300 shown in FIG. 3 as the address space 318. In some cases, the shifting shown in FIG. 4 may be accomplished by a second set of barrel shifters. In the illustrated example, the address space 400 again includes a column address space 402 or a high order address space and a row address space 404 or a low order address space. However, unlike FIG. 3, the column address bits "ABCD EFGH" assigned to represent the column address and row address bits "IJKL MNOP" assigned to represent the row address are initially out of order or twisted. For instance, in the address space 406 the column address bits "FGH" are located in the row address space 404 and the row address bits "IJK" are located in the column address space 402.

In the illustrated example, a first shift 408 on the address space 400 is shown by the line under the address space 406. In some cases, the first shift 408 may be performed by a first barrel shifter of the second set of barrel shifters and cause the entire address space 406 or the combined column address space 402 and the row address space 404 to shift to the right by a predetermined number of bits. In this example, the predetermined number of bits is the same number of bits used in the first shift 308, the second shift 312, and the third shift 316 of FIG. 3. The address space 410 illustrates the address space 400 after the first shift 408 has been completed. Thus, in the illustrated example, the row address bits "IJK" have been moved back the row address space 404.

A second shift 412 is then applied to the row address space 404. The second shift 412 may be applied by a second barrel shifter of the second set of barrel shifters and cause the bits in the row address space 404 to shift to the right by the predetermined number of bits (e.g., the same number of bits the address space 400 was moved in the first shift 408). The address space 414 illustrates the address space 400 after the second shift 412 has been completed. Thus, after the second shift 412, the column address bits shown in the address space 414 are the same bits as in the address space 410, as the bits in the column address space 402 were not moved as part of the operations associated with the second shift 412. However, the bits in the row address space 404 of the address space 414 have been moved to "FGHI JKLM" from "IJKL MFGH" shown in the address space 410.

A third shift 416 is then applied to the entire address space 400 or to the combined column address space 402 and the row address space 404 to move the column address bits and the row address bits to the left by the predetermined number of bits (e.g., the same number of bits in the first shift 408 and the second shift 412). For instance, a third barrel shifter of the first set of barrel shifters may cause the third shift 416 shown by the line under the address space 414. The address space 418 illustrates the address space 400 after both the third shift 416 has been completed and the untwist operations are completed. Thus, in the illustrated example, the column address space 402 includes the bits "ABCD EFGH" and the row address space 404 includes the bits "IJKL MNOP." In this manner, the column address bits and the row address bits are returned to the original position after the address space 400 was incremented to maintain a mapping the image data represented by the address space 400.

Figure 5:
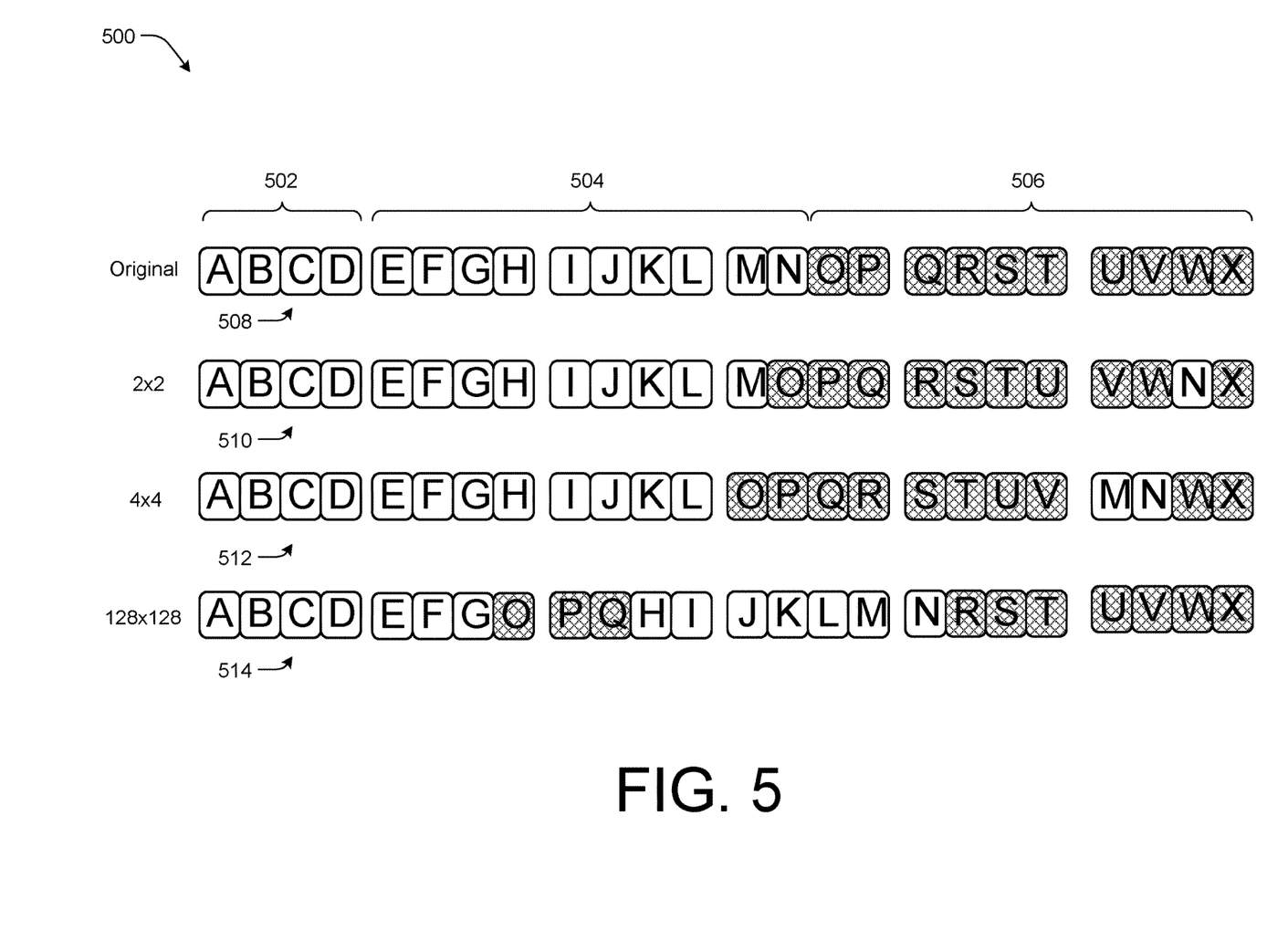
FIG. 5 is an example depicting results of different sized twists on an address space according to some implementations.

FIGS. 3 and 4 illustrated one example, twisting and untwisting operation to increment an address space. FIG. 5 below illustrated a few example twists of different sizes on an address space. In FIG. 5 the address space is extended or expanded to include one or more address bits related to the block size.

FIG. 5 is an example depicting results of different sized twists on an address space 500 according to some implementations. As described above, in some implementations, an address circuit may be configured to shift or move the high order address bits into the low order address space to allow an image to be parsed or processed in blocks rather than in rows or columns. The illustrated example shows an address space 500 broken down into bits "ABCD" in the extended address space 502 and configured to define a block size or shift size, column address bits "EFGH IJKL MN" in the high order space or the column address space 504, and row address bits "OP QRST UVWX" in the low order space or the row address space 506.

In the current example, the address space 500 representing a 1024×1024 image or smaller with h-blanking. The address space 508 shows an original state of the address space 500 including the extended address bits "ABCD" in the extended address space 502, the column address bits "EFGH IJKL MN" in the column address space 504, and the row address bits "OP QRST UVWX" in the row address space 506. It should be understood that, in cases in which the extended address bits "ABCD" represent the value "0000," the address circuit, described herein, increments the addresses row by row. However, FIG. 4 illustrates various twists based on other values resented by the extended address bits "ABCD" when applied to the address space 508.

For instance, in a first example illustrated by the address space 510, the address space 500 has been shifted according to a 2×2 block size. The extended address space 502 remain the same as the extended address bits "ABCD" are not included in the twisting process but used to define the block size or shift size applied by each of the barrel shifters. However, the column address space 504 and the row address space 506 shown in the address space 510 have been shifted. For instance, the column address space 504 of the address space 510 includes bits "EFGH IJKL MO" which includes bit "O" that represents a row address bit. Similarly, the row address space 506 illustrated in the address space 510 includes the bits "PQ RSTU VWNX" which includes bit "N" that represents a column address bit. Thus, the value represented by the address bit "N" will increment after the bit "X" but prior to each of the other row address bits. In this manner, the image data may be accessed in 2×2 blocks or in other words the address bit "N" will increment every other bit.

In another example, the address space 512 shows the address space 500 shifted by a 4×4 block size. The bits of the extended address space 502 remain the same as the extended address bits are not shifted. However, the column address space 504 is shifted to include the bits "EFGH IJKL OP" which includes row address bits "O" and "P." Similar, the row address space 506 are shifted to "QR STUV MNWX"

which includes column address bits "M" and "N." Thus, in this example, the column address bits will increment every fifth bit rather than every 11th bit.

In yet another example, the address bits 514 shows the address space 500 shifted by a 128×128 block size. Again, the bits of the extended address space 502 remain the same as the extended address bits "ABCD" are not shifted. However, in the example illustrated by the address space 514, the column address space 504 includes the bits "EFGO PQHI JK" which includes row address bits "OPQ." Similar, the row address space 506 includes the bits "LM NRST UVWX" after shifting, which includes the column address bits "LMN." Thus, the column address bits will increment every $8^{th}$ bit rather than every $11^{th}$ bit.

Figure 6:
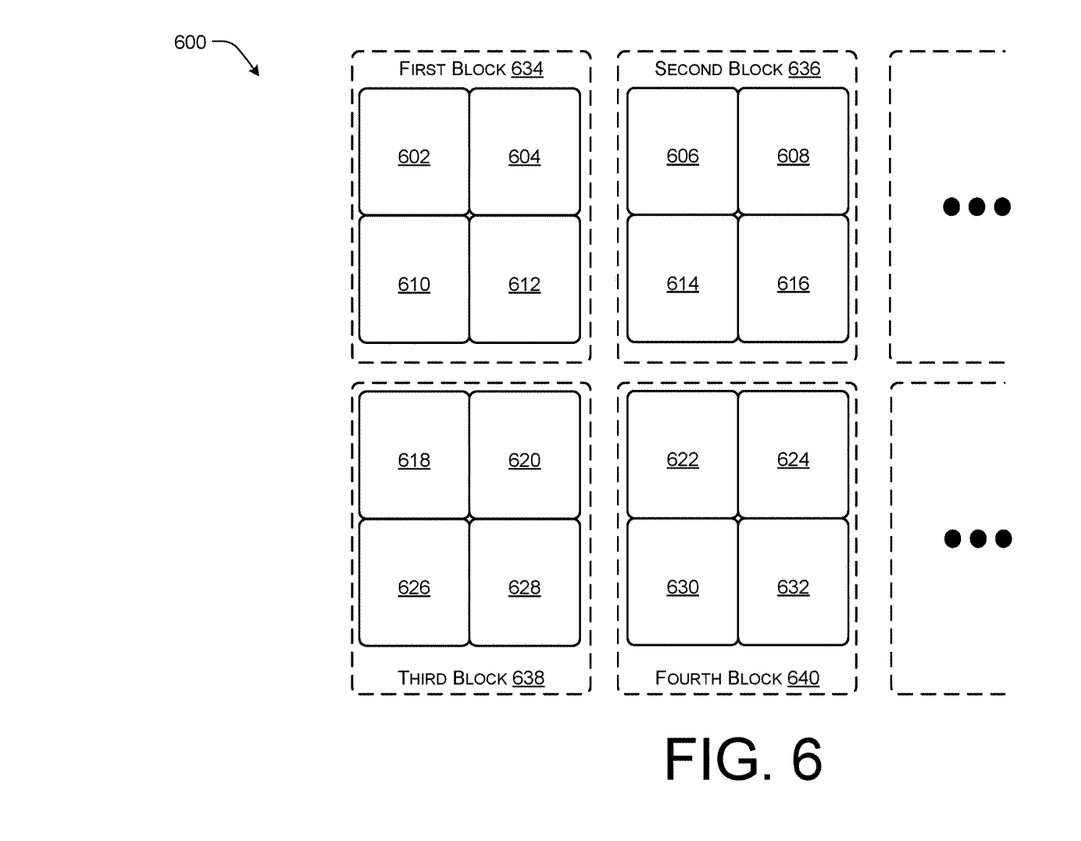
FIG. 6 is an example depicting an order of pixels accessed by an image processing system according to some implementations.

FIG. 6 is an example depicting an order of pixels accessed by an image processing system according to some implementations. In the current example, an entire 4×4 image 600 having 16 pixels 602-632 is shown being accessed based on 2×2 blocks (or a block size of two). In this example, an address space is configured with the column address bits as the high order bits and the row address bits as the low order bits.

In the illustrated example, an address circuit may be configured to twist the address space as shown above with respect to address space 300 and address bits 310 of FIG. 3 prior to incrementing the address value. For instance, the address circuit may twist the address space by shifting the combined column address bits and the row address bits to the right by two, the row address bits to the left by two, and the combined column address bits and the row address bits to the left by two. The address circuit may increment the value represented by the address by one. The address circuit then untwists the address by shifting the combined column address bits and the row address bits to the right by two, the row address bits to the right by two, and the combined column address bits and the row address bits to the left by two, as shown in the example of FIG. 4.

In the illustrated example, the twisting process occurs at least once, and the untwisting process occurs as each pixel of the image 600 is accessed or processed by an image processing unit. For instance, if the entire image 600 were to be processed using the 2×2 blocks by the address circuit described above, the image 600 may be accessed in four segments represented by blocks 634-640. In this instance, the blocks are accessed in the following order block 634, block 636, through the remaining blocks in the same row, followed by block 638, then block 640, etc.

In this example, the original address received by the address circuit may indicate the pixel 602 (e.g., the upper left hand corner of the image 600) as the starting position. In this example, the address circuit may receive the original address that may be passed or provided to the image processing unit. The address circuit may increment the address space via the twisting and untwisting operation to cause the address value to represent the pixel 604. The address circuit may provide the address value representing the pixel 604 to the image processing unit, for example, in response to receiving a signal from the image processing unit or a scheduler.

Once the address value representing the pixel 604 is provided, the address circuit again increments the address space. However, rather than proceeding to the pixel 606 following the current row, the twisting and untwisting operations cause the address value to point to the pixel 610. The address circuit may then provide the address value representing the pixel 610 to the image processing unit and increment the address value to correspond to the pixel 612 or the last pixel in the first block 632. In this manner, the image processing unit is able to access the image data or pixels in blocks rather than row by row. For instance, if the twisting and untwisting operations were not applied and the image processing unit was interested in the image data associated with the first block 634, the address circuit would have provided the pixels 602, 604, 606, 608, 610, and 612 causing the image processing unit to receive pixels 606 and 608 unnecessarily.

Returning to the current example, once the pixels 602, 604, 610, and 612 of the first block 634 are received, the address circuit increments the address space, which causes the address space to correspond to the pixel 608 (e.g., the upper right hand pixel of the second block 636). Continuing the example, the address circuit described herein utilizing a block size of two, would provide pixels 610, 614, and 616 to that order to the image processing unit to complete the second block 636. The address circuit continues to provide the pixels 618, 620, 626, and 628 of the third block 638 and followed by the pixels 622, 624, 630, and 632 of the fourth block 640. Thus, in the illustrated example, the image 600 is accessed in four blocks 634-640 rather than as four rows.

Figure 7:
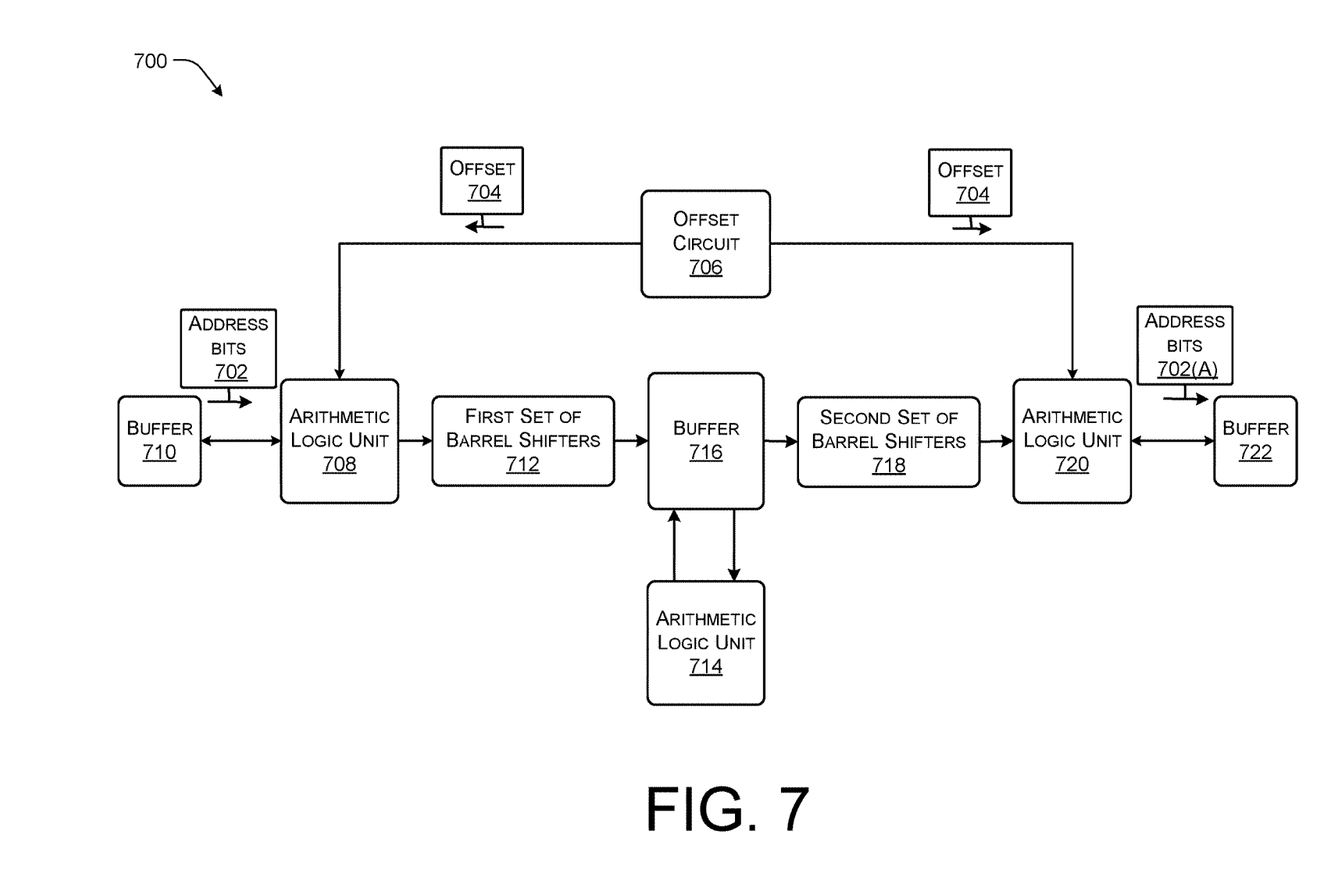
FIG. 7 illustrates a block diagram showing select components of an address circuit according to some implementations.

FIG. 7 illustrates a block diagram showing select components of an address circuit according to some implementations. The address circuit 700 may be configured to update an address space or increment address bits 702 associated with image data. In the illustrated example, the address circuit 700 may be configured to increment the address such that the image data may be accessed in square blocks having an upper left corner based on an offset value 704. In this manner, the circuit 700 may access blocks of various sizes at various starting locations within the image data.

In the illustrated example, the address circuit 700 may be configured to access a block of data based on an offset value 704. In some cases, the offset value 704 may be generated by an offset circuit 706. The offset value 704 may be provided to an ALU 708 configured to modify the address value presented by the address bits 702 by the offset 704. In some cases, a buffer 710 may be associated with the ALU 708 for passing the address bits 702 back and forth while the ALU 708 applies the offset 704.

The address circuit 700 also includes a first set of barrel shifters 712 in a data path before an address ALU 714 but after the ALU 708. As described above, the first set of barrel shifters 712 may be configured to twist the address space (e.g., moving some of the high order address bits into the low order space). For instance, if the address space includes the column address bits as the high order bits and the row address bits as the low order bits, the first set of barrel shifters 104 may shift some of the column address bits into the row address space.

The twisted address bits may be stored in an address buffer 708 that allows the address ALU 714 to modify the address bits 702 (e.g., increases the address value of the address by one or more). For example, the ALU 714 may be an incrementer configured to increase the value of the address by one. In this example, the twisted address bits may be passed back and forth between the address buffer 716 and the ALU 714 until a desired number of increments has been applied. In this manner, the address circuit 700 may modify the address by an amount greater than one without needing to untwist and re-twist the address bits 702.

In this example, since at least some of the column address bits have been shifted into the low order address space, the ALU 714 may modify the column address bits before reaching the end of the current row. In some cases, the ALU 714 may increment by one but in other cases, the ALU 714 may be configured to increment by a predetermined number of bits, such as to extract the red sub-pixels from RGBA data.

The address circuit 700 also includes a second set of barrel shifters 718 in the data path after the ALU 714. As described above, the second set of barrel shifters 718 may be configured to untwist the address space (e.g., moving the shifted high order address bits from the low order space back into the high order space). For instance, if the address space includes the column address bits as the high order bits and the row address bits as the low order bits, the second set of barrel shifters 718 may shift the column address bits back into the column address space to preserve the mapping of the address bits to the image data bits.

In the illustrated example, the address circuit 700 may include a third ALU 720 for removing the offset value 704 form the address bits 702. In some cases, a buffer 722 may be associated with the ALU 720 for passing the address bits 702 back and forth while the ALU 720 subtracts the offset 704.

Figure 8:
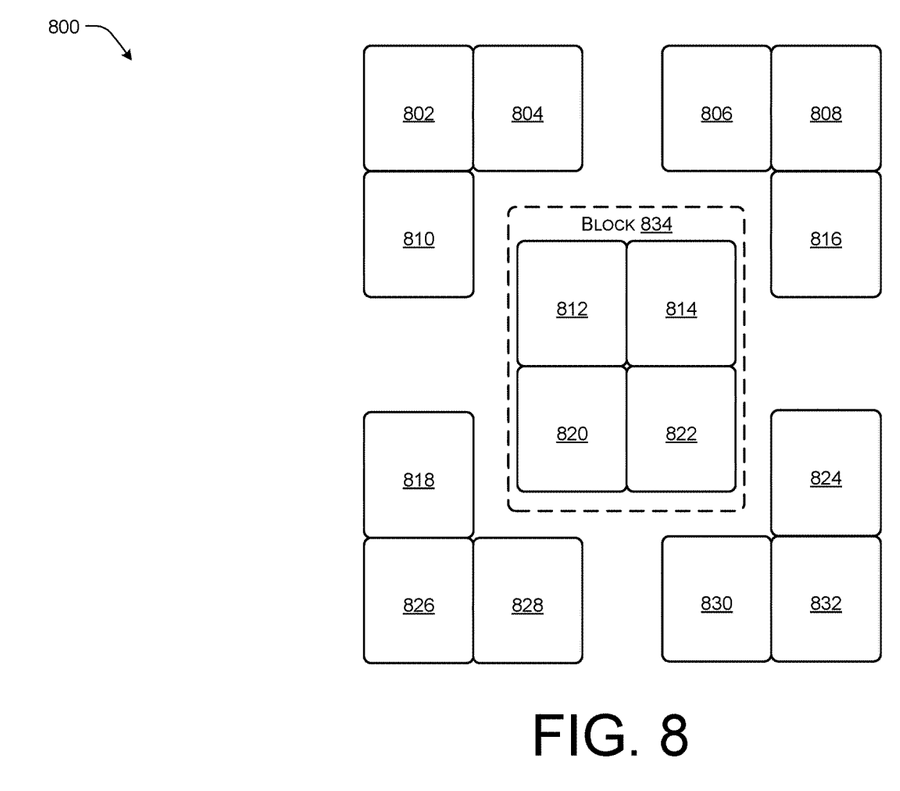
FIG. 8 is an example depicting a block of pixels accessed by an image processing system according to some implementations.

FIG. 8 is an example depicting a block of pixels accessed by an image processing system according to some implementations. In the current example, a portion of a 4×4 image 800 having 16 pixels 702-732 is shown being accessed based on 2×2 blocks (or a block size of two). In this example, an address space is configured with the column address bits as the high order bits and the row address bits as the low order bits. However, unlike FIG. 6, FIG. 8 illustrates a block 834 that is less than the entire image 800 being accessed based on an offset value, such as the offset 726 of FIG. 7. For instance, as shown in the illustrated example, a single block 834 of image data including four pixels 812, 814, 820, and 822 is being accessed.

As only the pixels 812, 814, 820, and 822 are being processed by an image processing unit, the address circuit may receive an original address or starting address pointing to the pixel 812 and a block size of two (e.g., setting the image data to be accessed according to 2×2 blocks). In this example, the address circuit may provide the original address to the image processing unit and proceed to increment the address space via the twisting and untwisting operations to allow the image processing unit to access the pixels 812, 814, 820, and 822 in order or as a 2×2 block without having to access the pixel 816 along the row associated with the pixel 812. In this manner, the processing and buffering requirements associated with the image processing system is reduced, as less bits are accessed by and/or provide to the image processing unit or buffered in a temporary memory or cache.

Figure 9:
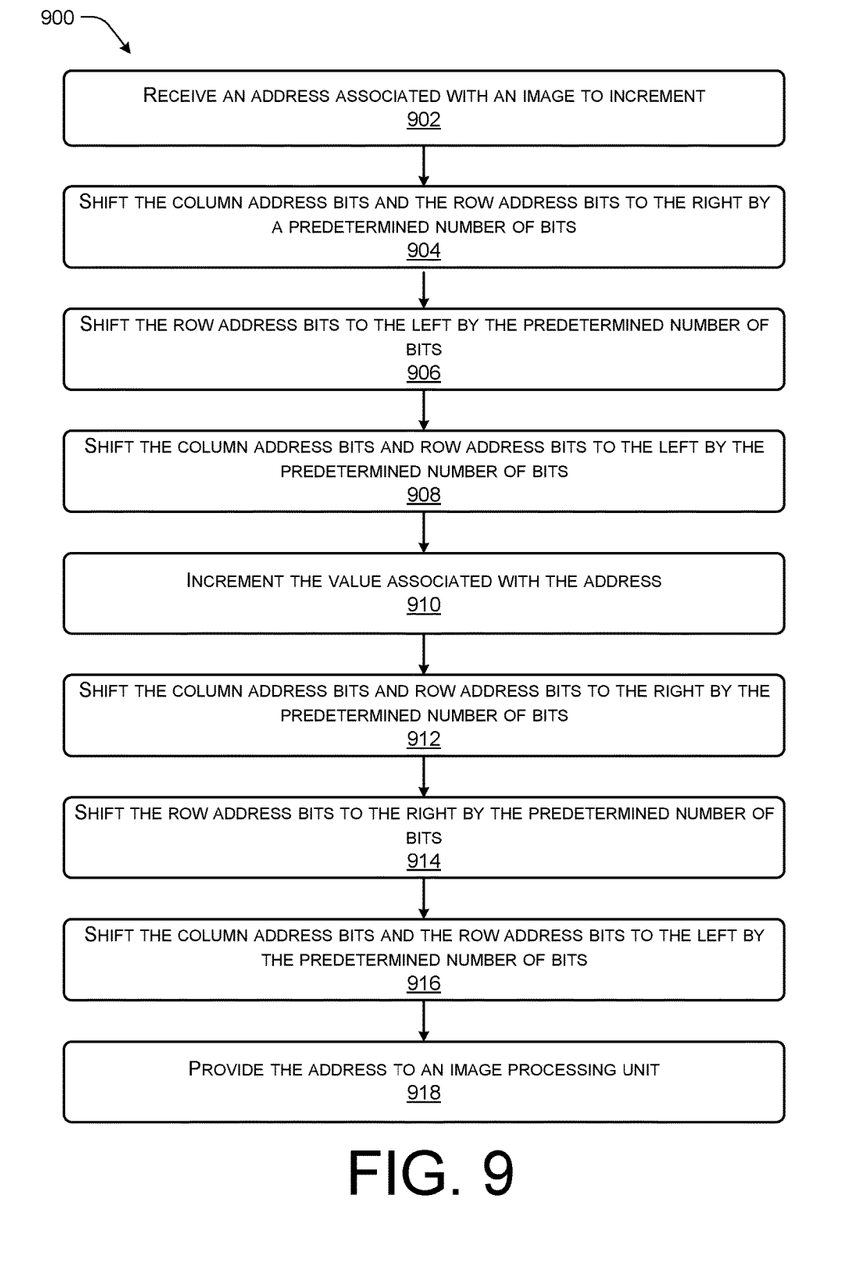
FIG. 9 illustrates an example flow diagram showing an illustrative process for addressing image data according to some implementations.

FIG. 9 is a flow diagram illustrating example processes for incrementing an address space as described herein. The process is illustrated as a collection of blocks in a logical flow diagram, which represent a sequence of operations, some or all of which can be implemented in hardware, software or a combination thereof. In the context of software, the blocks represent computer-executable instructions stored on one or more computer-readable media that, which when executed by one or more processors, perform the recited operations. Generally, computer-executable instructions include routines, programs, objects, components, data structures and the like that perform particular functions or implement particular abstract data types.

The order in which the operations are described should not be construed as a limitation. Any number of the described blocks can be combined in any order and/or in parallel to implement the process, or alternative processes, and not all of the blocks need be executed. For discussion purposes, the processes herein are described with reference to the frameworks, architectures and environments described in the examples herein, although the processes may be implemented in a wide variety of other frameworks, architectures or environments.

FIG. 9 illustrates an example flow diagram showing an illustrative process 900 for addressing image data according to some implementations. For instance, the illustrative process 900 provides an example in which an address space having the column address bits as the high order bits and the row address bits as the low order bits is incremented by an address circuit. At 902, the address circuit receives an address associated with an image to increment. For example, the address may include a row (X) and column (Y) coordinate to indicate a particular pixel of the image.

At 904, the address circuit may shift the column address bits and the row address bits to the right by a predetermined number of bits. For example, a first barrel shifter may include one or more pass gates configured to shift the bits of the address space by the predetermined number bits. In some cases, the predetermined number of bits may be associated with the size of the block of image data to be accessed. For instance, the predetermined number may be set to a value of four when a four by four block of data is the targeted segment of the image. In some implementations, the block size may be fixed, while in other implementations, the block size may be set on the fly or at the time the starting address is received at the address circuit.

At 906, the address circuit shifts the row address bits to the left by the predetermined number of bits. For instance, a second barrel shifter may be configured or include one or more pass gates to cause the row address bits to be shifted to the left by the predetermined number of bits.

At 908, the address circuit shifts the column address bits and the row address bits to the left by the predetermined number of bits. For instance, a third barrel shifter may be configured or include one or more pass gates to cause the column address bits and the row address bits to be shifted to the left by the predetermined number of bits.

At 910, the address circuit increments the value associated with the address. For instance, in the four by four block example on a 1024×1024 pixel image, and address space may be represented by "ABCD EFGH IJKL MNOP QRST UVWX," where the extended address bits may be "ABCD" and the column address bits may be "EFGH IJKL MN" and row address bits may be "OP QRST UVWX." The twisted address space using a 4×4 block may be represented as the bits "EFGH IJKL OPQR STUV MNWX." In this example, if the original value of the address was "0010 0001 10̲11 0101 0011" and the twisted address bits have a value of "0010 0001 1101 0100 10̲11" including the underlined column address bits "MN." Thus, if the value was incremented, the incremented value of the twisted address is "0010 0001 1101 0100 11̲00" and the column address bit "N" was flipped or set in the place that the row address bit "V" would normally have done so.

At 912, the address circuit may shift the column address bits and the row address bits to the right by the predetermined number of bits. For example, a fourth barrel shifter may include one or more pass gates configured to shift the bits of the address space to the right by the predetermined number bits. In this case, the predetermined number of bits is the same number of bits used to twist the address space prior to incrementing the address space.

At 914, the address circuit shifts the row address bits to the right by the predetermined number of bits. For instance, a second barrel shifter may be configured or include one or more pass gates to cause the row address bits to be shifted to the right by the predetermined number of bits.

At 916, the address circuit shifts the column address bits and the row address bits to the left by the predetermined number of bits. For instance, a third barrel shifter may be configured or include one or more pass gates to cause the column address bits and the row address bits to be shifted to the left by the predetermined number of bits.

At 918, the address circuit provides the untwisted address to an image processing unit. For instance, returning to the example in 810, the twisted address included the bits "EFGH IJKL OPQR STUV MNWX" having an incremented value of "0010 0001 1101 0100 1100". The untwisted address may be again represented by "EFGH IJKL MNOP QRST UVWX" and have a value of "0010 0001 1111 0101 0000". Thus, in this example, the column address was incremented by one prior to reaching a value of "11 1111 1111" in the row address space or the last pixel in a row of the image.

Although the subject matter has been described in language specific to structural features and/or methodological acts, it is to be understood that the subject matter defined in the appended claims is not necessarily limited to the specific features or acts described. Rather, the specific features and acts are disclosed as exemplary forms of implementing the claims.

What is claimed is:

1. A system comprising:
   an image capturing component to capture image data;
   a data buffer to receive the image data from the image capturing component and to store the image data, the image data stored in the data buffer and accessible according to a set of address bits, the set of address bits having high order address bits and low order address bits;
   an address circuit to receive the set of address bits and to generated incremented address bits by performing operations to shift the high order address bits and the low order address bits in a rightward direction by a number of bits, shift the low order address bits in a leftwards direction by the number of bits, shift the high order address bits and the low order address bits in the leftward direction by the number of bits, increment the set of address bits, shift the high order address bits and the low order address bits in the rightward direction by a number of bits, shift the low order address bits in the rightward direction by the number of bits, and shift the high order address bits and the low order address bits in the leftward direction by the number of bits; and
   an image processing unit to perform at least one operation on the image data stored in the data buffer based at least in part on the incremented address bits.

2. The system of claim 1, wherein the address circuit includes:
   a first barrel shifter configured to shift the high order address bits and the low order address bits in the rightward direction by the number of bits;
   a second barrel shifter configured to shift the low order address bits in the leftward direction by the number of bits; and
   a third barrel shifter configured to shift the high order address bits and the low order address bits in the leftward direction by the number of bits.

3. The system of claim 2, wherein the address circuit includes:
   a fourth barrel shifter configured to shift the high order address bits and the low order address bits of in the rightward direction by a number of bits;
   a fifth barrel shifter configured to shift the low order address bits in the rightward direction by the number of bits; and
   a sixth barrel shifter configured to shift the high order address bits and the low order address bits in the leftward direction by the number.

4. The system of claim 1, wherein the address circuit includes an arithmetic logic unit to increment the set of address bits.

5. The system of claim 1, wherein the address circuit includes an address buffer to store the set of address bits while the set of address bits are incremented.

6. The system of claim 1, wherein the set of address bits includes at least one bit representative of the number of bits.

7. The system of claim 1, wherein the high order address bits are column address bits and the low order address bits are row address bits.

8. The system of claim 1, wherein the high order address bits are row address bits and the low order address bits are column address bits.

9. The system of claim 1, wherein the set of address bits indicate a value associated with the number of bits.

10. A system comprising:
    a data buffer to receive image data from the image capturing component and to store the image data, the image data stored in the data buffer accessible according to a set of address bits, the set of address bits having high order address bits and low order address bits; and
    an address circuit to receive the set of address bits and to generated a set of twisted address bits by shifting the high order bits and low order bits of the set of address bits in a rightward direction, shifting the low order bits of the set of address bits in a leftwards direction, and shifting the high order bits and the low order bits of the set of address bits in the leftward direction.

11. The system of claim 10, wherein the address circuit is further configured to untwist the set of twisted address bits by shifting the high order bits and the low order bits of the set of twisted address bits in the rightward direction, shifting the low order bits of the address of the set of twisted address bits in the rightward direction, and shifting the high order bits and the low order bits of the set of twisted address bits in the leftward direction.

12. The system of claim 10, wherein the address circuit is further configured to increment the set of twisted address bits.

13. The system of claim 10, further comprising an image capturing component to capture image data from an environment.

14. The system of claim 10, further comprising an image data input component configured to provide the image data to the data buffer.

15. The system of claim 10, wherein the address circuit is configured to shift the high order bits and the low order bits by a predetermined number of bits in the rightward direction and to shift the high order bits and the low order bits by the predetermined number of bits in the leftward direction.

16. A method comprising:
    shifting high order bits and low order bits of an address in a rightward direction by a predetermined number of bits; shifting the low order bits of the address in a leftward direction by the predetermined number of bits; shifting the high order bits and the low order bits of the address in the leftward direction by the predetermined number of bits; and storing the address in an address buffer.

17. The method of claim 16, further comprising modifying a value of the address stored in the address buffer.

18. The method of claim 17, further comprising:
shifting the high order bits and the low order bits of an address in the rightward direction by the predetermined number of bits;
shifting the low order bits of the address in the rightward direction by the predetermined number of bits; and
shifting the high order bits and the low order bits of the address in the leftward direction by the predetermined number of bits.

19. The method of claim 18, further comprising sending the address to an image processing unit.

20. The method of claim 18, further comprising processing an image based at least in part on the address.

* * * * *